US011249386B2

(12) United States Patent
Jindal et al.

(10) Patent No.: US 11,249,386 B2
(45) Date of Patent: Feb. 15, 2022

(54) EXTREME ULTRAVIOLET MASK WITH BACKSIDE COATING

(71) Applicant: Applied Materials, Inc., Santa Clara, CA (US)

(72) Inventors: Vibhu Jindal, San Jose, CA (US); Madhavi R Chandrachood, Sunnyvale, CA (US); Vikash Banthia, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 208 days.

(21) Appl. No.: 16/662,742

(22) Filed: Oct. 24, 2019

(65) Prior Publication Data

US 2020/0133114 A1 Apr. 30, 2020

Related U.S. Application Data

(60) Provisional application No. 62/751,239, filed on Oct. 26, 2018.

(51) Int. Cl.
*G03F 1/24* (2012.01)
*G03F 7/20* (2006.01)

(52) U.S. Cl.
CPC ............ *G03F 1/24* (2013.01); *G03F 7/70033* (2013.01)

(58) Field of Classification Search
CPC ............................... G03F 1/24; G03F 7/70033
USPC .............................................................. 430/5
See application file for complete search history.

(56) References Cited

U.S. PATENT DOCUMENTS 6,737,201 B2 5/2004 Shoki et al.
8,003,282 B2 8/2011 Hayashi et al.
10,747,102 B2 * 8/2020 Jindal ....................... G03F 1/52
10,915,015 B2 * 2/2021 Kim .......................... G03F 1/24
2002/0076625 A1 6/2002 Shoki et al.
2004/0067420 A1 4/2004 Ota
2009/0253055 A1 10/2009 Hayashi et al.
2017/0160632 A1 6/2017 Hassan et al.
2020/0026178 A1 * 1/2020 Jindal ..................... C23C 28/44

FOREIGN PATENT DOCUMENTS

JP 2018146945 A 9/2018

OTHER PUBLICATIONS

PCT International Search Report and Written Opinion in PCT/US2019/058012 dated Feb. 7, 2020, 12 pages.

* cited by examiner

*Primary Examiner* — Christopher G Young
(74) *Attorney, Agent, or Firm* — Servilla Whitney LLC

(57) ABSTRACT

Extreme ultraviolet (EUV) mask blanks, methods for their manufacture and production systems therefor are disclosed. The EUV mask blanks comprise a substrate having a first side and a second side; a backside coating layer comprising an alloy of tantalum and nickel on the first side of the substrate; a multilayer stack of reflective layers on the second side of the substrate, the multilayer stack of reflective layers including a plurality of reflective layers including reflective layer pairs; a capping layer on the multilayer stack of reflecting layers; and an absorber layer on the capping layer.

20 Claims, 6 Drawing Sheets

EXTREME ULTRAVIOLET MASK WITH BACKSIDE COATING

TECHNICAL FIELD

The present disclosure relates generally to extreme ultraviolet lithography, and more particularly extreme ultraviolet mask blanks with a backside coating layer comprising an alloy of tantalum and nickel, and methods of manufacture.

BACKGROUND

Extreme ultraviolet (EUV) lithography, also known as soft x-ray projection lithography, is used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer ultraviolet light.

FIG. 1 shows a conventional EUV reflective mask 10, which is formed from an EUV mask blank, which includes a reflective multilayer stack 12 on a substrate 14, which reflects EUV radiation at unmasked portions by Bragg interference. Masked (non-reflective) areas 16 of the conventional EUV reflective mask 10 are formed by etching buffer layer 18 and absorbing layer 20. The absorbing layer typically has a thickness in a range of 51 nm to 77 nm. A capping layer 22 is formed over the reflective multilayer stack 12 and protects the reflective multilayer stack 12 during the etching process. EUV mask blanks are made of on a low thermal expansion material substrate coated with multilayers, capping layer and an absorbing layer, which is then etched to provide the masked (non-reflective) areas 16 and reflective areas 24.

A backside coating layer 26, which is typically a coating of chromium nitride (CrN), is provided on the opposing side of substrate 14, as shown in FIG. 1. The backside layer must offer resistivity, a proper coefficient of friction, proper hardness, proper roughness, proper optical density, lack of defects, and non-uniformity. The current solution, i.e. a CrN backside coating layer, results in a higher defect rate than desired during chucking. CrN also requires a higher-than-desired thickness, due to the relatively low conductivity of CrN. While titanium boron alloys have been proposed to provide a reduced thickness, such backside coating layers have been found to exhibit low durability during the etching process. As EUV lithography has evolved, a need has arisen to provide an EUV mask blank with a backside layer with improved properties.

SUMMARY

One or more embodiments of the disclosure are directed to an extreme ultraviolet (EUV) mask blank that includes a substrate having a first side and a second side, a backside coating layer comprising an alloy of tantalum and nickel on the first side of the substrate, a multilayer stack of reflective layers on the second side of the substrate, the multilayer stack of reflective layers including a plurality of reflective layers including reflective layer pairs, a capping layer on the multilayer stack of reflective layers, and an absorber layer on the capping layer.

Additional embodiments of the disclosure are directed to a method of manufacturing an extreme ultraviolet (EUV) mask blank that includes providing a substrate having a first side and a second side, forming a backside coating layer comprising an alloy of tantalum and nickel on the first side of the substrate, forming a multilayer stack of reflective layers on the second side of the substrate, the multilayer stack of reflective layers including a plurality of reflective layer pairs, forming a capping layer on the multilayer stack of reflective layers, and forming an absorber layer on the capping layer.

Additional embodiments of the disclosure are directed to an extreme ultraviolet (EUV) lithography system that includes an extreme ultraviolet light source, and a reticle comprising a substrate having a first side and a second side, a backside coating layer comprising an alloy of tantalum and nickel on the first side of the substrate, a multilayer stack on the second side of the substrate, and an absorber layer, over the multilayer stack, with a thickness of less than 80 nm and less than 2% reflectivity of an extreme ultraviolet (EUV) light at a wavelength of 13.5 nm;

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term “horizontal” as used herein is defined as a plane parallel to the plane or surface of a mask blank, regardless of its orientation. The term “vertical” refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification according to one or more embodiments, the terms "precursor", "reactant", "reactive gas" and the like are used interchangeably to refer to any gaseous species that reacts with the substrate surface.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate refers to only a portion of the substrate, unless the context clearly indicates otherwise. Additionally, reference to depositing on a substrate means both a bare substrate and a substrate with one or more films or features deposited or formed thereon.

Figure 1:
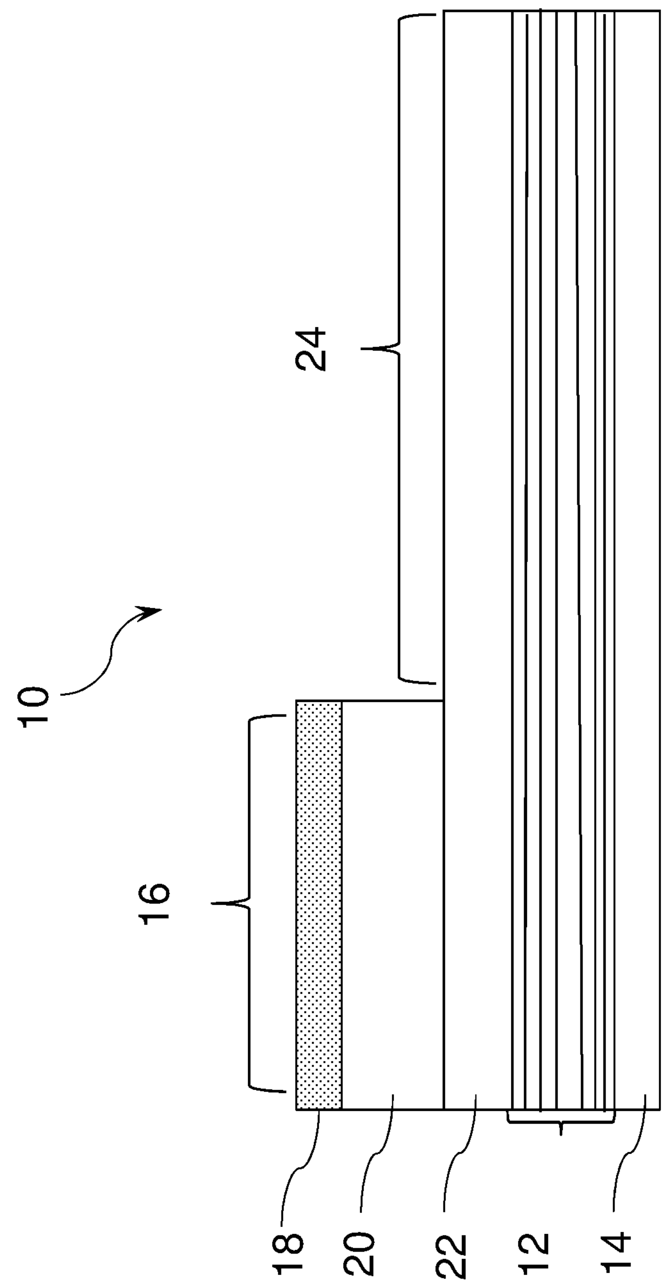
FIG. 1 schematically illustrates a background art EUV reflective mask employing a conventional backside material (CrN)
Figure 2:
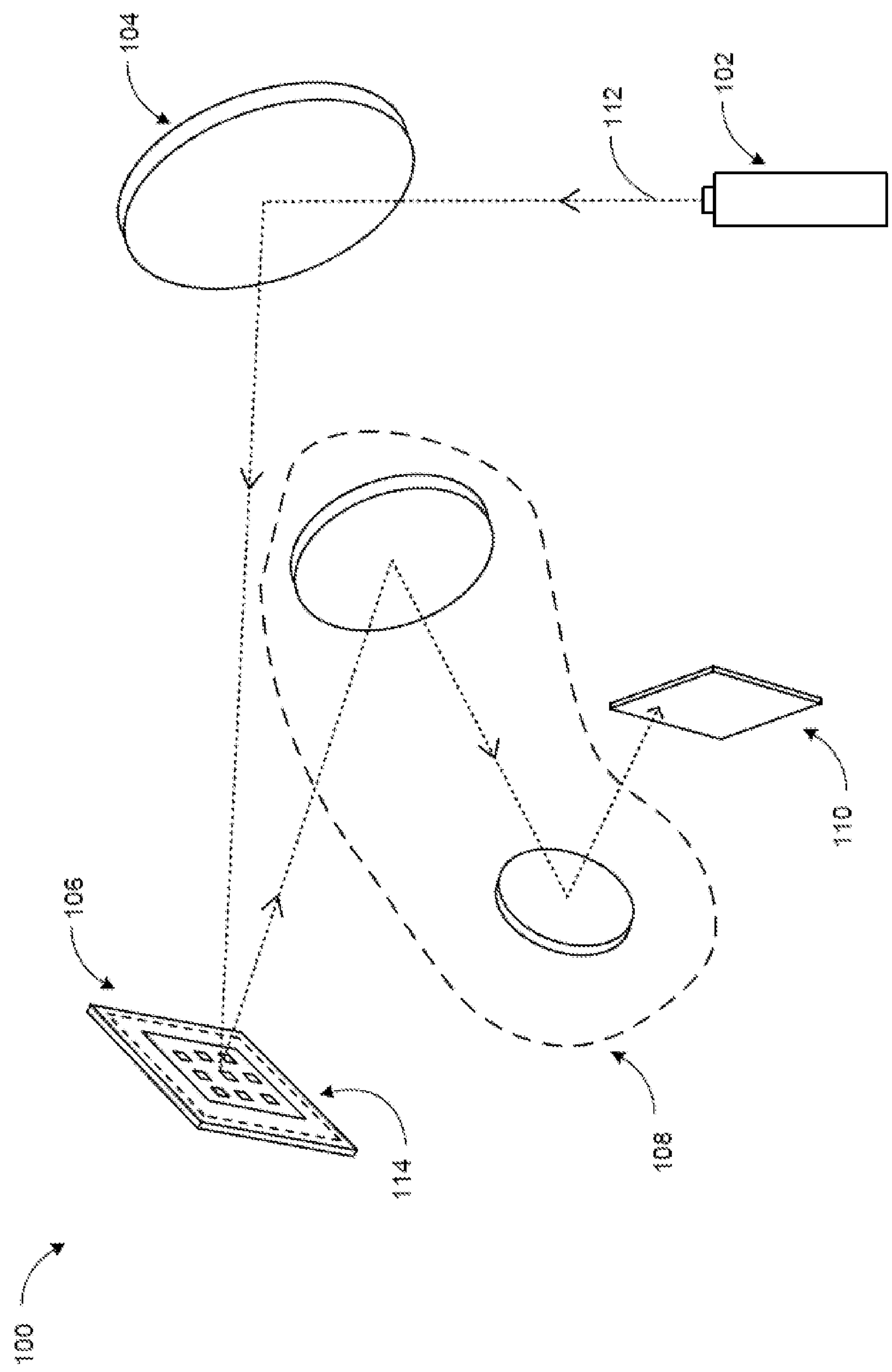
FIG. 2 schematically illustrates an embodiment of an EUV lithography system.

Referring now to FIG. 2, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nm. For example, the extreme ultraviolet light source 102 includes a laser, a laser produced plasma, a discharge produced plasma, a free-electron laser, synchrotron radiation, or a combination thereof.

The extreme ultraviolet light source 102 generates the extreme ultraviolet light 112 having a variety of characteristics. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106.

Although the condenser 104 is shown as a single element, it is understood that the condenser 104 in some embodiments includes one or more reflective elements such as concave mirrors, convex mirrors, flat mirrors, or a combination thereof, for reflecting and concentrating the extreme ultraviolet light 112. For example, in some embodiments, the condenser 104 is a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 in some embodiments includes mirrors and other optical elements to reduce the size of the image of the mask pattern 114. For example, the optical reduction assembly 108 includes concave mirrors for reflecting and focusing the extreme ultraviolet light 112.

The optical reduction assembly 108 reduces the size of the image of the mask pattern 114 on the target wafer 110. For example, the mask pattern 114 in some embodiments is imaged at a 4:1 ratio by the optical reduction assembly 108 on the target wafer 110 to form the circuitry represented by the mask pattern 114 on the target wafer 110. The extreme ultraviolet light 112 scans the EUV reflective mask 106 synchronously with the target wafer 110 to form the mask pattern 114 on the target wafer 110.

Figure 3:
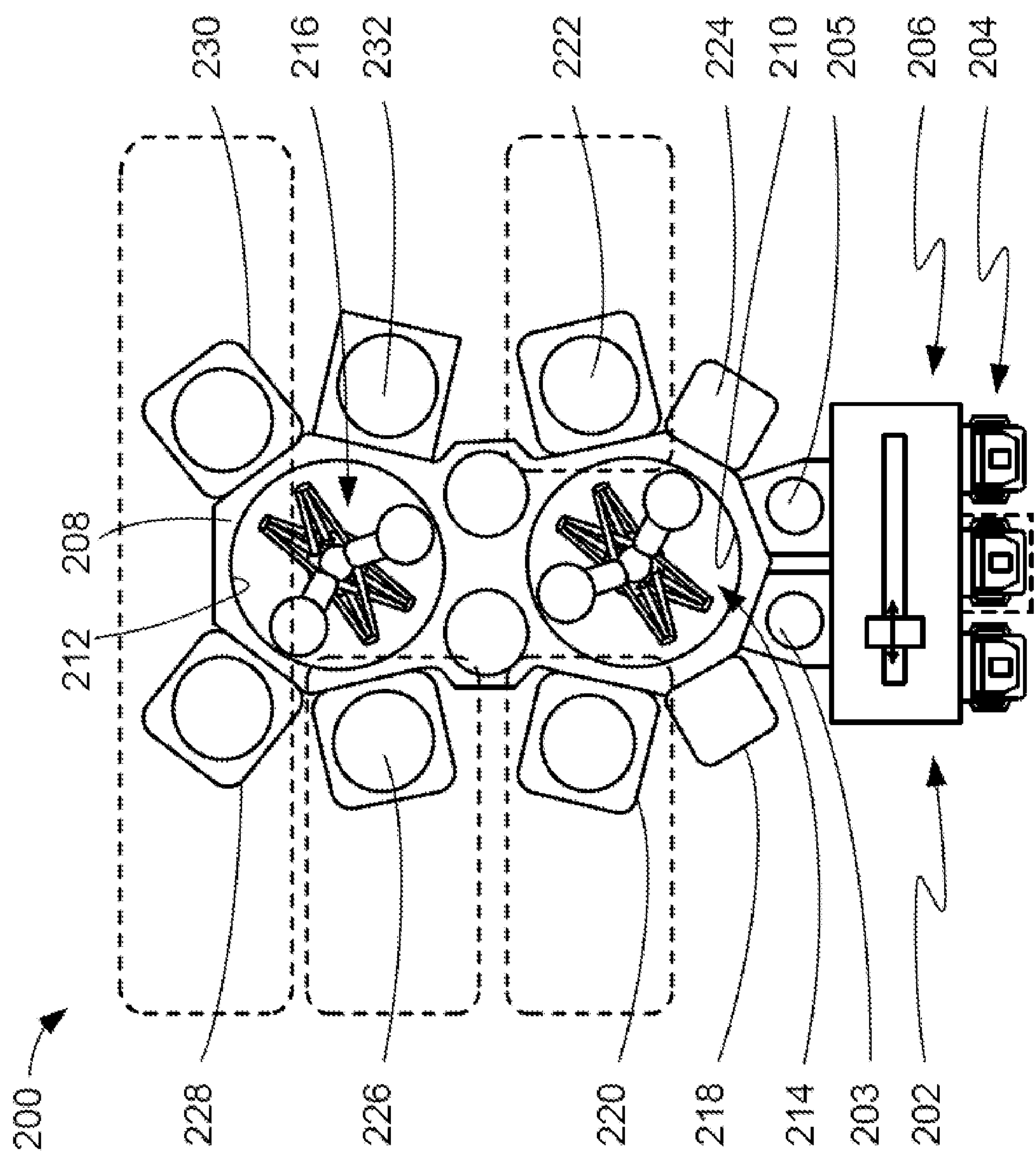
FIG. 3 illustrates an embodiment of an EUV reflective element production system.

Referring now to FIG. 3, an embodiment of an extreme ultraviolet reflective element production system 200 is shown. The extreme ultraviolet reflective element includes an EUV mask blank 204, an extreme ultraviolet mirror 205, or other reflective element such as an EUV reflective mask 106.

The extreme ultraviolet reflective element production system 200 produces mask blanks, mirrors, or other elements that reflect the extreme ultraviolet light 112 of FIG. 2. The extreme ultraviolet reflective element production system 200 fabricates the reflective elements by applying thin coatings to source substrates 203.

With reference to FIG. 3, the EUV mask blank 204 is a multilayered structure for forming the EUV reflective mask 106 of FIG. 2. In some embodiments, the EUV mask blank 204 is formed using semiconductor fabrication techniques. The EUV reflective mask 106 has the mask pattern 114 of FIG. 2 formed on the EUV mask blank 204 by etching and other processes.

The extreme ultraviolet mirror 205 is a multilayered structure reflective in a range of extreme ultraviolet light. The extreme ultraviolet mirror 205 in some embodiments is formed using semiconductor fabrication techniques. The EUV mask blank 204 and the extreme ultraviolet mirror 205 in some embodiments are similar structures with respect to the layers formed on each element, however, the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 have an extreme ultraviolet reflectivity of greater than 60%. The reflective elements are generally considered efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 in some embodiments includes substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 in some embodiments contains two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system of one or more embodiments has any number of vacuum chambers.

The wafer handling vacuum chamber 208 in some embodiments has a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, in some embodiments are used to form thin films of conductive materials on the source substrates 203. For example, the physical vapor deposition systems in some embodiments includes a vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

The physical vapor deposition system forms reflective layers, capping layers, and absorber layers. For example, the physical vapor deposition systems of some embodiments forms layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds of some embodiments include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 of some embodiments includes a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 in some embodiments is in a separate system from the extreme ultraviolet reflective element production system 200.

The chemical vapor deposition system 228 of some embodiments forms thin films of material on the source substrates 203. For example, the chemical vapor deposition system 228 in some embodiments is used to form layers of materials on the source substrates 203 including monocrystalline layers, polycrystalline layers, amorphous layers, epitaxial layers, or a combination thereof. The chemical vapor deposition system 228 of some embodiments forms layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system of some embodiments forms planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 of some embodiments transfers the source substrates 203 and the EUV mask blank 204 between the first wafer handling system 214, the second wafer handling system 216 in a continuous vacuum.

Figure 4:
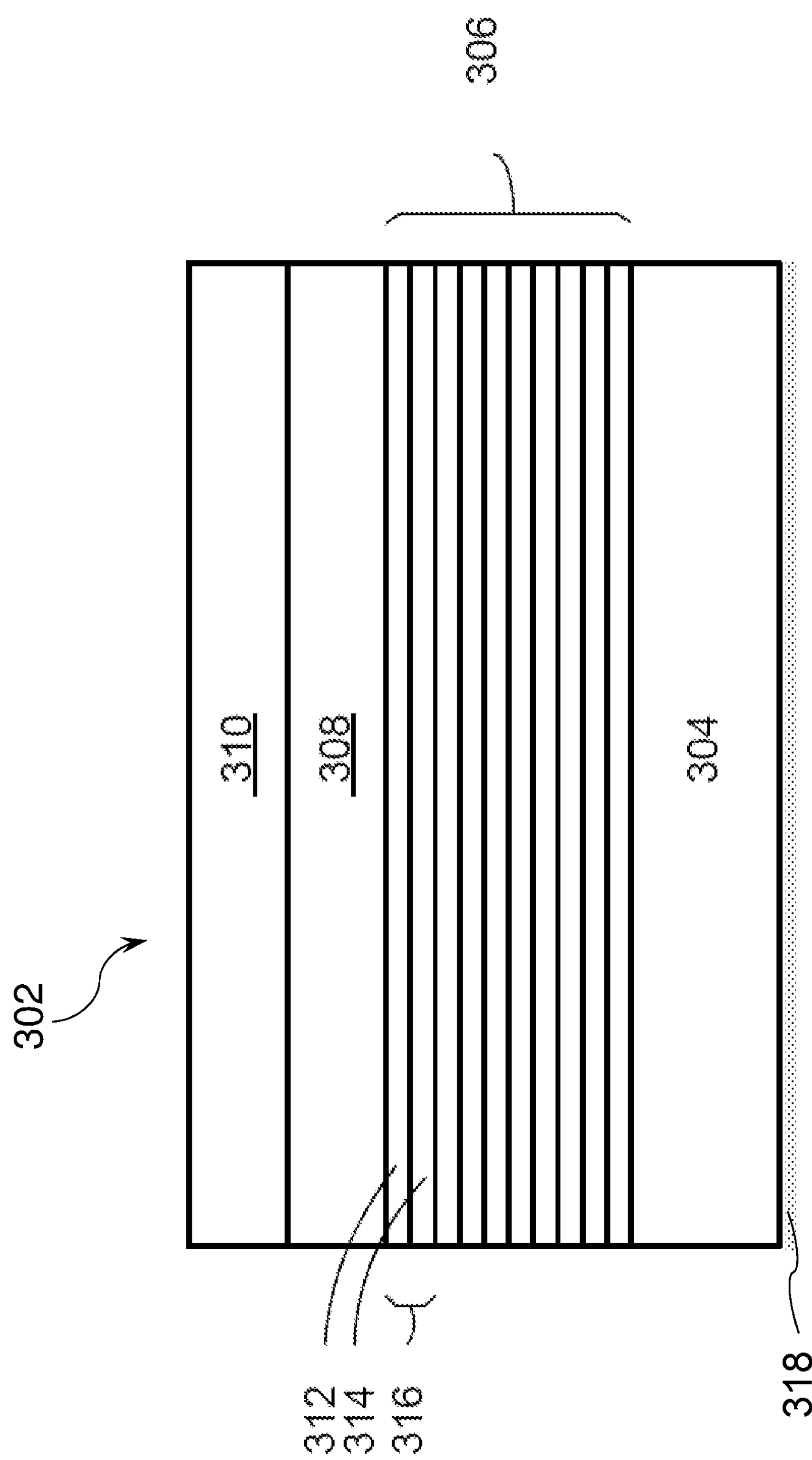
FIG. 4 illustrates an embodiment of an EUV reflective element such as an EUV mask blank.

Referring now to FIG. 4, an embodiment of an extreme ultraviolet reflective element 302 is shown. In one or more embodiments, the extreme ultraviolet reflective element 302 is the EUV mask blank 204 of FIG. 3 or the extreme ultraviolet mirror 205 of FIG. 3. The EUV mask blank 204 and the extreme ultraviolet mirror 205 are structures for reflecting the extreme ultraviolet light 112 of FIG. 2. The EUV mask blank 204 in some embodiments is used to form the EUV reflective mask 106 shown in FIG. 2.

The extreme ultraviolet reflective element 302 includes a substrate 304, a multilayer stack 306 of reflective layers, and a capping layer 308. In one or more embodiments, the extreme ultraviolet mirror 205 is used to form reflecting structures for use in the condenser 104 of FIG. 2 or the optical reduction assembly 108 of FIG. 2.

The extreme ultraviolet reflective element 302, which in some embodiments is an EUV mask blank 204, includes the substrate 304, the multilayer stack 306 of reflective layers, the capping layer 308, and an absorber layer 310. The extreme ultraviolet reflective element 302 in some embodiments is an EUV mask blank 204, which is used to form the EUV reflective mask 106 of FIG. 2 by patterning the absorber layer 310 with the layout of the circuitry required. The absorber layer, in certain embodiments, is coated with an antireflective coating (not shown), such as an antireflective coating selected from, for example, tantalum oxynitride and tantalum boron oxide.

In the following sections, the term for the EUV mask blank 204 is used interchangeably with the term of the extreme ultraviolet mirror 205 for simplicity. In one or more embodiments, the EUV mask blank 204 includes the components of the extreme ultraviolet mirror 205 with the absorber layer 310 added in addition to form the mask pattern 114 of FIG. 2.

The EUV mask blank 204 is an optically flat structure used for forming the EUV reflective mask 106 having the mask pattern 114, which represents a processing layer of an integrated circuit. The reflective mask 106, once fully processed, in some embodiments is referred to as a reticle. In one or more embodiments, the reflective surface of the EUV mask blank 204 forms a flat focal plane for reflecting the incident light, such as the extreme ultraviolet light 112 of FIG. 2.

With reference to FIG. 4, the substrate 304 is an element for providing structural support to the extreme ultraviolet reflective element 302. In one or more embodiments, the substrate 304 is made from a material having a low coefficient of thermal expansion (CTE) to provide stability during temperature changes. In one or more embodiments, the substrate 304 has properties such as stability against mechanical cycling, thermal cycling, crystal formation, or a combination thereof. The substrate 304 according to one or more embodiments is formed from a material such as, for example, silicon, glass, oxides, ceramics, glass ceramics, or a combination thereof.

The multilayer stack 306 is a structure that is reflective to the extreme ultraviolet light 112. The multilayer stack 306 includes alternating reflective layers of a first reflective layer 312 and a second reflective layer 314. The first reflective layer 312 and the second reflective layer 314 form a reflective pair 316 of FIG. 4. In a non-limiting embodiment, the multilayer stack 306 includes a range of 20-60 of the reflective pairs 316 for a total of up to 120 reflective layers.

The first reflective layer 312 and the second reflective layer 314 in some embodiments are formed from a variety of materials. In an embodiment, the first reflective layer 312 and the second reflective layer 314 are formed from silicon and molybdenum, respectively. Although the layers are shown as silicon and molybdenum, it is understood that the alternating layers in some embodiments are formed from other materials or have other internal structures.

The first reflective layer 312 and the second reflective layer 314 has a variety of structures according to various embodiments. In an embodiment, both the first reflective layer 312 and the second reflective layer 314 are formed with a single layer, multiple layers, a divided layer structure, non-uniform structures, or a combination thereof.

Because most materials absorb light at extreme ultraviolet wavelengths, the optical elements used are reflective, instead of the transmissive as used in other lithography systems. The multilayer stack 306 forms a reflective structure by having alternating thin layers of materials with different optical properties to create a Bragg reflector or mirror.

In an embodiment, each of the alternating layers has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13 nm, the alternating layers are about 6.5 nm thick. It is understood that the sizes and dimensions provided are within normal engineering tolerances for typical elements.

The multilayer stack 306 in some embodiments is formed in a variety of ways. In an embodiment, the first reflective layer 312 and the second reflective layer 314 are formed with magnetron sputtering, ion sputtering systems, pulsed laser deposition, cathode arc deposition, or a combination thereof.

In an illustrative embodiment, the multilayer stack 306 is formed using a physical vapor deposition technique, such as magnetron sputtering. In an embodiment, the first reflective layer 312 and the second reflective layer 314 of the multilayer stack 306 have the characteristics of being formed by the magnetron sputtering technique including precise thickness, low roughness, and clean interfaces between the layers. In an embodiment, the first reflective layer 312 and the second reflective layer 314 of the multilayer stack 306 have the characteristics of being formed by the physical vapor deposition including precise thickness, low roughness, and clean interfaces between the layers.

The physical dimensions of the layers of the multilayer stack 306 formed using the physical vapor deposition technique in some embodiments are precisely controlled to increase reflectivity. In an embodiment, the first reflective layer 312, such as a layer of silicon, has a thickness of 4.1 nm. The second reflective layer 314, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm in some embodiments is reduced.

In an embodiment, the multilayer stack 306 has a reflectivity of greater than 60%. In an embodiment, the multilayer stack 306 formed using physical vapor deposition has a reflectivity in a range of 66%-67%. In one or more embodiments, forming the capping layer 308 over the multilayer stack 306 formed with harder materials improves reflectivity. In some embodiments, reflectivity greater than 70% is achieved using low roughness layers, clean interfaces between layers, improved layer materials, or a combination thereof.

In one or more embodiments, the capping layer 308 is a protective layer allowing the transmission of the extreme ultraviolet light 112. In an embodiment, the capping layer 308 is formed directly on the multilayer stack 306. In one or more embodiments, the capping layer 308 protects the multilayer stack 306 from contaminants and mechanical damage. In one embodiment, the multilayer stack 306 is sensitive to contamination by oxygen, carbon, hydrocarbons, or a combination thereof. The capping layer 308 according to an embodiment interacts with the contaminants to neutralize them.

In one or more embodiments, the capping layer 308 is an optically uniform structure that is transparent to the extreme ultraviolet light 112. The extreme ultraviolet light 112 passes through the capping layer 308 to reflect off of the multilayer stack 306. In one or more embodiments, the capping layer 308 has a total reflectivity loss of 1% to 2%. In one or more embodiments, each of the different materials has a different reflectivity loss depending on thickness, but all of them will be in a range of 1% to 2%.

In one or more embodiments, the capping layer 308 has a smooth surface. For example, the surface of the capping layer 308 has a roughness of less than 0.2 nm RMS (root mean square measure). In another example, the surface of the capping layer 308 has a roughness of 0.08 nm RMS for a length in a range of 1/100 nm and 1/1 μm. The RMS roughness will vary depending on the range over which it is measured. For the specific range of 100 nm to 1 micron that roughness is 0.08 nm or less. Over a larger range, the roughness will be higher.

The capping layer 308 in some embodiments is formed in a variety of methods. In an embodiment, the capping layer 308 is formed on or directly on the multilayer stack 306 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 308 has the physical characteristics of being formed by the magnetron sputtering technique including precise thickness, low roughness, and clean interfaces between the layers. In an embodiment, the capping layer 308 has the physical characteristics of being formed by the physical vapor deposition including precise thickness, low roughness, and clean interfaces between the layers.

In one or more embodiments, the capping layer 308 is formed from a variety of materials having a hardness sufficient to resist erosion during cleaning. In one embodiment, ruthenium is used as a capping layer material because it is a good etch stop and is relatively inert under the operating conditions. However, it is understood that other materials in some embodiments are used to form the capping layer 308. In specific embodiments, the capping layer 308 has a thickness in a range of 2.5 and 5.0 nm.

In one or more embodiments, the absorber layer 310 is a layer that absorbs the extreme ultraviolet light 112. In an embodiment, the absorber layer 310 is used to form the pattern on the EUV reflective mask 106 by providing areas that do not reflect the extreme ultraviolet light 112. The absorber layer 310, according to one or more embodiments, comprises a material having a high absorption coefficient for a particular frequency of the extreme ultraviolet light 112, such as about 13.5 nm. In an embodiment, the absorber layer 310 is formed directly on the capping layer 308, and the absorber layer 310 is etched using a photolithography process to form the pattern of the EUV reflective mask 106.

According to one or more embodiments, the extreme ultraviolet reflective element 302, such as the extreme ultraviolet mirror 205, is formed with the substrate 304, the multilayer stack 306, and the capping layer 308. The extreme ultraviolet mirror 205 has an optically flat surface and can efficiently and uniformly reflect the extreme ultraviolet light 112.

According to one or more embodiments, the extreme ultraviolet reflective element 302, such as the EUV mask blank 204, is formed with the backside coating layer 318, substrate 304, the multilayer stack 306, the capping layer 308, and the absorber layer 310. The mask blank 204 has an optically flat surface and can efficiently and uniformly reflect the extreme ultraviolet light 112. In an embodiment, the mask pattern 114 is formed with the absorber layer 310 of the EUV mask blank 204.

According to one or more embodiments, forming the absorber layer 310 over the capping layer 308 increases reliability of the EUV reflective mask 106. The capping layer 308 acts as an etch stop layer for the absorber layer 310. When the mask pattern 114 of FIG. 2 is etched into the absorber layer 310, the capping layer 308 beneath the absorber layer 310 stops the etching action to protect the multilayer stack 306. In one or more embodiments, the absorber layer 310 is etch selective to the capping layer 308. In some embodiments, the capping layer 308 comprises ruthenium, and the absorber layer 310 is etch selective to ruthenium. As an example, the absorber layer 310 includes tantalum nitride. In one or more embodiments, the absorber layer is co-sputtered in a physical deposition chamber. In other embodiments, the absorber layer is deposited layer by layer as a laminate of a first material and a second material.

The underside of substrate 304 is provided with backside coating layer 318, which includes an alloy of tantalum and nickel. In one embodiment, the backside coating layer 318 is an amorphous film.

The alloy of tantalum and nickel, included in backside coating layer 318, provides a hardness to improve durability while maintaining a suitable coefficient of friction (μ) and resistivity, all at relatively lower thickness than backside coating layers comprised of other materials. The instant alloy of tantalum and nickel also provides a hardness, roughness, and optical density that, when included in the backside coating layer, provides advantages over CrN and other materials that have been previously employed as backside coating layers. Similarly, the instant alloy of tantalum and nickel yields a backside coating layer that is less prone to defects and has a suitable non-uniformity.

In one embodiment, the backside coating layer 26 comprises a thickness ranging from 0.1 nm to about 50 nm, or from about 0.1 to about 40 nm, or from about 0.1 to about 30 nm, or from about 0.1 to about 25 nm, or from about 0.1 to about 20 nm. As noted, in certain embodiments, the alloy of tantalum and nickel allows for the backside coating layer to be provided at lower thicknesses, as compared to backside coating layers comprised of other materials, while maintaining at least substantially similar performance, or superior performance, to these other materials.

In one or more embodiments, the alloy of tantalum and nickel is selected from an alloy having from about 70 wt. % to about 85 wt. % tantalum and from about 15 wt. % to about 30 wt. % nickel, an alloy having from about 45 wt. % to about 55 wt. % tantalum and from about 45 wt. % to about 55 wt. % nickel, and an alloy having from about 30 wt. % to about 45 wt. % tantalum and from about 55 wt. % to about 70 wt. % nickel, all weight percent (wt. %) based upon the total weight of the alloy.

In other embodiments, the alloy of tantalum and nickel is selected from an alloy having from about 70 wt. % to about 75 wt. % tantalum and from about 25 wt. % to about 30 wt. % nickel, an alloy having from about 48 wt. % to about 55 wt. % tantalum and from about 45 wt. % to about 52 wt. % nickel, and an alloy having from about 35 wt. % to about 45 wt. % tantalum and from about 55 wt. % to about 65 wt. % nickel, all weight percent (wt. %) based upon the total weight of the alloy.

In a specific embodiment, the alloy of tantalum and nickel is a tantalum rich alloy. As used herein, the term "tantalum rich" means that there is significantly more tantalum in the alloy than nickel. For example, in a specific embodiment, the alloy of tantalum and nickel is an alloy having from about 70 wt. % to about 85 wt. % tantalum and from about 15 wt. % to about 30 wt. % nickel. In another specific embodiment, the alloy of tantalum and nickel is an alloy having from about 70 wt. % to about 75 wt. % tantalum and from about 25 wt. % to about 30 wt. % nickel.

In another specific embodiment, the alloy of tantalum and nickel is an equal ratio alloy. As used herein, the term "equal ratio" means that there is approximately the same amount of tantalum and nickel present, by weight, in the alloy. For example, in an embodiment, the alloy of tantalum and nickel is an alloy having from about 45 wt. % to about 55 wt. % tantalum and from about 45 wt. % to about 55 wt. % nickel. In another embodiment, the alloy of tantalum and nickel is an alloy having from about 48 wt. % to about 55 wt. % tantalum and from about 45 wt. % to about 52 wt. % nickel.

In a still further specific embodiment, the alloy of tantalum and nickel is a nickel rich alloy. As used herein, the term "nickel rich" means that there is significantly more nickel in the alloy than tantalum. For example, in an embodiment, the alloy of tantalum and nickel is an alloy having from about 30 wt. % to about 45 wt. % tantalum and from about 55 wt. % to about 70 wt. % nickel. In another embodiment, the alloy of tantalum and nickel is an alloy having from about 35 wt. % to about 45 wt. % tantalum and from about 55 wt. % to about 65 wt. % nickel.

In one or more embodiments, the alloy of tantalum and nickel comprises a dopant. The dopant may be selected from one or more of boron, nitrogen or oxygen. In an embodiment, the dopant comprises oxygen. In an alternative embodiment, the dopant comprises nitrogen. In an alternative embodiment, the dopant comprises boron. In one embodiment, the dopant comprises a combination of one or more of boron, nitrogen and oxygen (e.g., boron and nitrogen, boron and oxygen, oxygen and nitrogen).

In an embodiment, the dopant is present in the alloy in an amount in the range of about 0.1 wt. % to about 10 wt. %, based upon the weight of the alloy. In other embodiments, the dopant is present in the alloy in an amount of about 0.1 wt. %, 0.2 wt. %, 0.3 wt. %, 0.4 wt. %, 0.5 wt. %, 0.6 wt.

%, 0.7 wt. %. 0.8 wt. %, 0.9 wt. %, 1.0 wt. %, 1.1 wt. %, 1.2 wt. %, 1.3 wt. %, 1.4 wt. %, 1.5 wt. %, 1.6 wt. %, 1.7 wt. %. 1.8 wt. %, 1.9 wt. %, 2.0 wt. % 2.1 wt. %, 2.2 wt. %, 2.3 wt. %, 2.4 wt. %, 2.5 wt. %, 2.6 wt. %, 2.7 wt. %. 2.8 wt. %, 2.9 wt. %, 3.0 wt. %, 3.1 wt. %, 3.2 wt. %, 3.3 wt. %, 3.4 wt. %, 3.5 wt. %, 3.6 wt. %, 3.7 wt. %. 3.8 wt. %, 3.9 wt. %, 4.0 wt. %, 4.1 wt. %, 4.2 wt. %, 4.3 wt. %, 4.4 wt. %, 4.5 wt. %, 4.6 wt. %, 4.7 wt. %. 4.8 wt. %, 4.9 wt. %, 5.0 wt. %, 5.1 wt. %, 5.2 wt. %, 5.3 wt. %, 5.4 wt. %, 5.5 wt. %, 5.6 wt. %, 5.7 wt. %, 5.8 wt. %, 5.9 wt. %, 6.0 wt. %, 6.1 wt. %, 6.2 wt. %, 6.3 wt. %, 6.4 wt. %, 6.5 wt. %, 6.6 wt. %, 6.7 wt. %, 6.8 wt. %, 6.9 wt. %, 7.0 wt. %, 7.1 wt. %, 7.2 wt. %, 7.3 wt. %, 7.4 wt. %, 7.5 wt. %, 7.6 wt. %, 7.7 wt. %, 7.8 wt. %, 7.9 wt. %, 8.0 wt. %, 8.1 wt. %, 8.2 wt. %, 8.3 wt. %, 8.4 wt. %, 8.5 wt. %, 8.6 wt. %, 8.7 wt. %, 8.8 wt. %, 8.9 wt. %, 9.0 wt. %, 9.1 wt. %, 9.2 wt. %, 9.3 wt. %, 9.4 wt. %, 9.5 wt. %, 9.6 wt. %, 9.7 wt. %, 9.8 wt. %, 9.9 wt. %, or 10.0 wt. %.

In one or more embodiments, the alloy of the backside coating layer is a co-sputtered alloy formed in a physical deposition chamber, which provides much thinner backside coating layer thickness (e.g., less than 30 nm). In one or more embodiments, the alloy of the backside coating layer is co-sputtered by gases selected from one or more of argon (Ar), oxygen ($O_2$), or nitrogen ($N_2$). In an embodiment, the alloy of the backside coating layer is co-sputtered by a mixture of argon and oxygen gases ($Ar+O_2$). In some embodiments, co-sputtering by a mixture of argon and oxygen forms and oxide of nickel and/or an oxide of tantalum. In other embodiments, co-sputtering by a mixture of argon and oxygen does not form an oxide of nickel or tantalum. In an embodiment, the alloy of the backside coating layer is co-sputtered by a mixture of argon and nitrogen gases ($Ar+N_2$). In some embodiments, co-sputtering by a mixture of argon and nitrogen forms a nitride of nickel and/or a nitride of tantalum. In other embodiments, co-sputtering by a mixture of argon and nitrogen does not form a nitride of nickel or tantalum. In an embodiment, the alloy of the backside coating layer is co-sputtered by a mixture of argon and oxygen and nitrogen gases ($Ar+O_2+N_2$). In some embodiments, co-sputtering by a mixture of argon and oxygen and nitrogen forms an oxide and/or nitride of nickel and/or an oxide and/or nitride of tantalum. In other embodiments, co-sputtering by a mixture of argon and oxygen and nitrogen does not form an oxide or a nitride of nickel or tantalum. In an embodiment, the etch properties and/or other properties of the backside coating layer are tailored to specification by controlling the alloy percentage(s), as discussed above. In an embodiment, the alloy percentage(s) are precisely controlled by operating parameters such voltage, pressure, flow, etc., of the physical vapor deposition chamber. In an embodiment, a process gas is used to further modify the material properties, for example, $N_2$ gas is used to form nitrides of tantalum and nickel.

In one or more embodiments, as used herein "co-sputtering" means that two targets, one target comprising nickel and the second target comprising tantalum are sputtered at the same time using one or more gas selected from argon (Ar), oxygen ($O_2$), or nitrogen ($N_2$) to deposit/form a backside coating layer comprising an alloy of tantalum and nickel.

In other embodiments, the alloy of tantalum and nickel are deposited layer by layer as a laminate of tantalum and nickel layers using gases selected from one or more of argon (Ar), oxygen ($O_2$), or nitrogen ($N_2$). In an embodiment, tantalum and nickel are deposited layer by layer as a laminate of tantalum and nickel layers using a mixture of argon and oxygen gases ($Ar+O_2$). In some embodiments, layer by layer deposition using a mixture of argon and oxygen forms an oxide of nickel and/or an oxide of tantalum. In other embodiments, layer by layer deposition using a mixture of argon and oxygen does not form an oxide of nickel or tantalum. In an embodiment, the alloy of the backside coating layer is deposited layer by layer as a laminate of tantalum and nickel layers using a mixture of argon and nitrogen gases ($Ar+N_2$). In some embodiments, layer by layer deposition using a mixture of argon and nitrogen forms a nitride of nickel and/or a nitride of tantalum. In other embodiments, layer by layer deposition using a mixture of argon and nitrogen does not form a nitride of nickel or tantalum. In an embodiment, the alloy of the backside coating layer is deposited layer by layer as a laminate of tantalum and nickel layers using a mixture of argon and oxygen and nitrogen gases ($Ar+O_2+N_2$). In some embodiments, layer by layer depositing using a mixture of argon and oxygen and nitrogen forms an oxide and/or nitride of nickel and/or an oxide and/or nitride of tantalum. In other embodiments, layer by layer deposition using a mixture of argon and oxygen and nitrogen does not form an oxide or a nitride of nickel or tantalum.

In one or more embodiments, bulk targets of the alloy compositions described herein may be made, which are sputtered by normal sputtering using gases selected from one or more of argon (Ar), oxygen ($O_2$), or nitrogen ($N_2$). In one or more embodiments, the alloy of tantalum and nickel is deposited using a bulk target having the same composition of the alloy and is sputtered using a gas selected from one or more of argon (Ar), oxygen ($O_2$), or nitrogen ($N_2$) to form the backside coating layer. In an embodiment, the alloy of the backside coating layer is deposited using a bulk target having the same composition of the alloy and is sputtered using a mixture of argon and oxygen gases ($Ar+O_2$). In some embodiments, bulk target deposition using a mixture of argon and oxygen forms an oxide of nickel and/or an oxide of tantalum. In other embodiments, bulk target deposition using a mixture of argon and oxygen does not form an oxide of nickel or tantalum. In an embodiment, the alloy of the backside coating layer is deposited using a bulk target having the same composition of the alloy and is sputtered using a mixture of argon and nitrogen gases ($Ar+N_2$). In some embodiments, bulk target deposition using a mixture of argon and nitrogen forms a nitride of nickel and/or a nitride of tantalum. In other embodiments, bulk target deposition using a mixture of argon and nitrogen does not form a nitride of nickel or tantalum. In an embodiment, the alloy of the backside coating layer is deposited using a bulk target having the same composition of the alloy and is sputtered using a mixture of argon and oxygen and nitrogen gases ($Ar+O_2+N_2$). In some embodiments, bulk target depositing using a mixture of argon and oxygen and nitrogen forms an oxide and/or nitride of nickel and/or an oxide and/or nitride of tantalum. In other embodiments, bulk target deposition using a mixture of argon and oxygen and nitrogen does not form an oxide or a nitride of nickel or tantalum.

Figure 5:
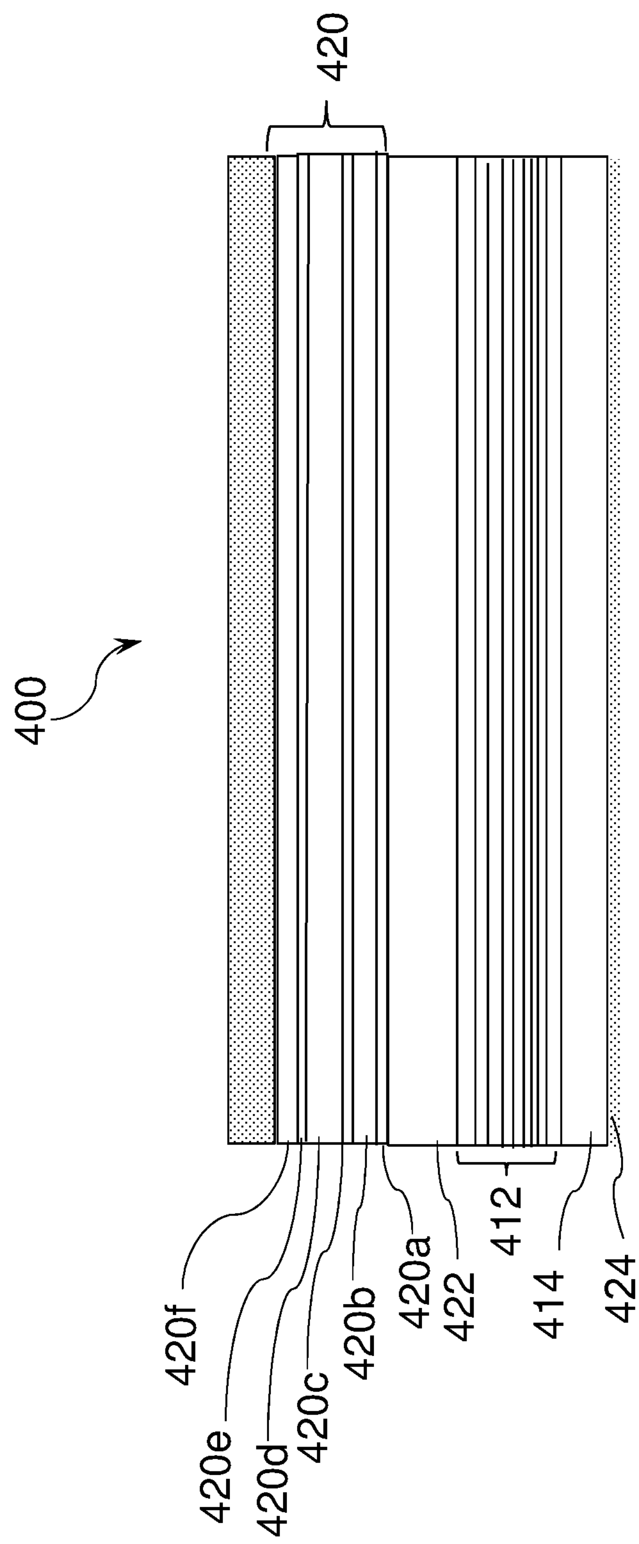
FIG. 5 illustrates an embodiment of an EUV reflective element such as an EUV mask blank.

Referring now to FIG. 5, an extreme ultraviolet mask blank 400 is shown as comprising a backside coating layer 424, a substrate 414, a multilayer stack of reflective layers 412 on the substrate 414, the multilayer stack of reflective layers 412 including a plurality of reflective layer pairs. In one or more embodiments, the plurality of reflective layer pairs are made from a material selected from a molybdenum (Mo) containing material and silicon (Si) containing material. In some embodiments, the plurality of reflective layer pairs comprise alternating layers of molybdenum and silicon. The extreme ultraviolet mask blank 400 further includes a capping layer 422 on the multilayer stack of reflective layers 412, and there is a multilayer stack 420 of absorber layers on the capping layer 422. In one or more embodiment, the plurality of reflective layers 412 are selected from a molybdenum (Mo) containing material and a silicon (Si) containing material and the capping layer 422 comprises ruthenium. A multilayer stack 420 of absorber layers including a plurality of absorber layer pairs 420*a*, 420*b*, 420*c*, 420*d*, 420*e*, 420*f* is also provided. The backside coating layer 424 includes an alloy of tantalum and nickel, and in some embodiments, includes any one of the alloy compositions disclosed herein.

According to one or more embodiments, the different absorber materials and thickness of the absorber layers are selected so that extreme ultraviolet light is absorbed due to absorbance and due to a phase change caused by destructive interfere with light from the multilayer stack of reflective layers. While the embodiment shown in FIG. 5 shows three absorber layer pairs, 420*a*/420*b*, 420*c*/420*d* and 420*e*/420*f*, the disclosure should not be limited to a particular number of absorber layer pairs. According to one or more embodiments, the EUV mask blank 400 includes a range of 5 and 60 absorber layer pairs or a range of 10 and 40 absorber layer pairs.

According to one or more embodiments, the absorber layer(s) have a thickness which provides less than 2% reflectivity and other etch properties. A supply gas in some embodiments is used to further modify the material properties of the absorber layer(s), for example, nitrogen ($N_2$) gas is used to form nitrides of the materials provided above. The multilayer stack of absorber layer(s) according to one or more embodiments is a repetitive pattern of individual thickness of different materials so that the EUV light not only gets absorbed due to absorbance, but by the phase change caused by multilayer absorber stack, which will destructively interfere with light from multilayer stack of reflective materials beneath to provide better contrast.

Another aspect of the disclosure pertains to a method of manufacturing an extreme ultraviolet (EUV) mask blank comprising providing a substrate having a first side and a second side, forming a backside coating layer on the first side of the substrate, forming a multilayer stack of reflective layers on the second side of the substrate, the multilayer stack including a plurality of reflective layer pairs, forming a capping layer on the multilayer stack of reflective layers, and forming absorber layer on the capping layer, the backside coating layer comprising an alloy of tantalum and nickel, such as any one of the alloys described herein.

The EUV mask blank of one or more embodiments has any of the characteristics of the embodiments described above with respect to FIG. 4 and FIG. 5, and the method in some embodiments is performed in the system described with respect to FIG. 3.

Figure 6:
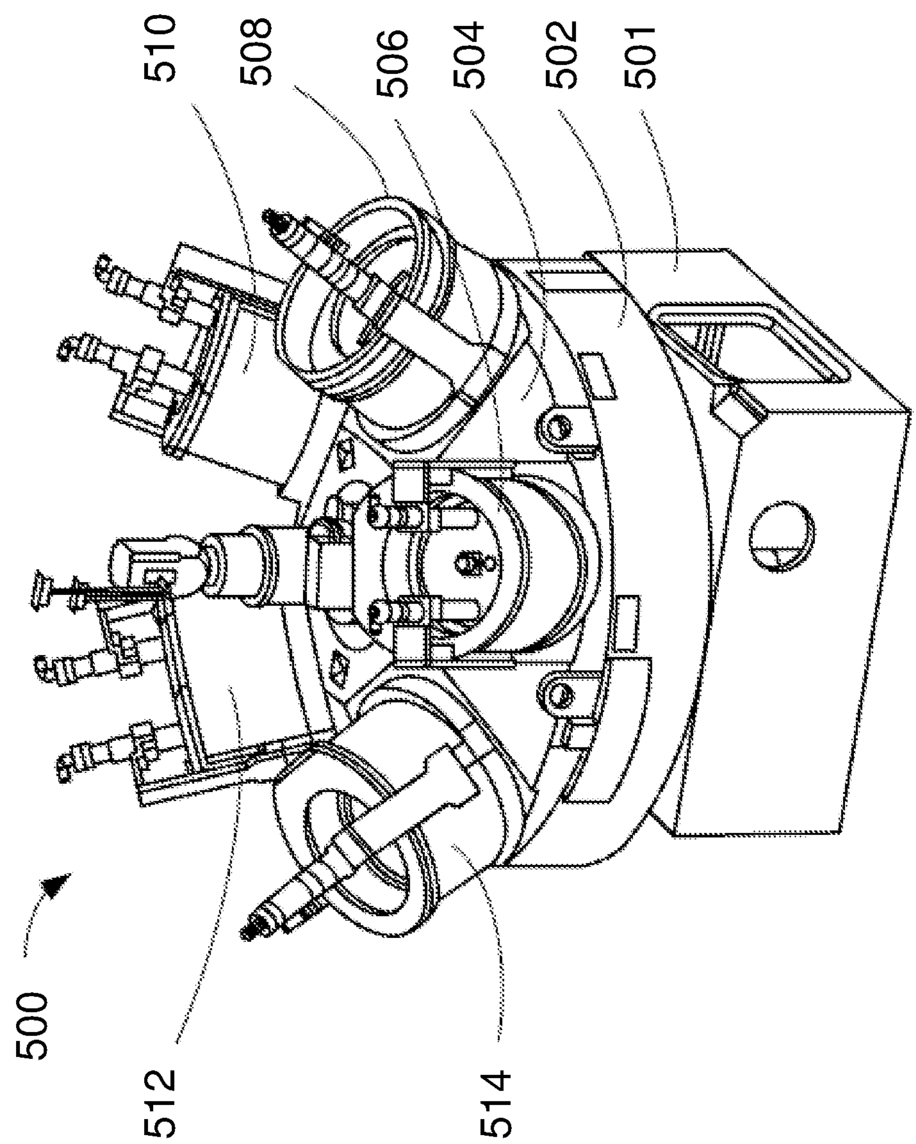
FIG. 6 illustrates an embodiment of a multi-cathode physical deposition chamber.

Referring now to FIG. 6 an upper portion of a multi-cathode source chamber 500 is shown in accordance with one particular embodiment. The multi-cathode chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 504.

The multi-cathode source chamber 500 in some embodiments is part of the system shown in FIG. 3. In an embodiment, an extreme ultraviolet (EUV) mask blank production system comprises a substrate handling vacuum chamber for creating a vacuum, a substrate handling platform, in the vacuum, for transporting a substrate loaded in the substrate handling vacuum chamber, and multiple sub-chambers, accessed by the substrate handling platform, for forming an EUV mask blank, including a multilayer stack of reflective layers on the substrate, the multilayer stack including a plurality of reflective layer pairs, a capping layer on the multilayer stack reflective layers, and an absorber layer on the capping layer, the backside coating layer including an alloy of tantalum and nickel. The system in some embodiments is used to make the EUV mask blanks shown with respect to FIG. 4 or FIG. 5 and have any of the properties described with respect to the EUV mask blanks described with respect to FIG. 4 or FIG. 5 above.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An extreme ultraviolet (EUV) mask blank comprising:
- a substrate having a first side and a second side;
- a backside coating layer comprising an alloy of tantalum and nickel on the first side of the substrate, the backside coating layer having a thickness in a range of from 0.1 nm to 50 nm;
- a multilayer stack of reflective layers on the second side of the substrate, the multilayer stack of reflective layers including a plurality of reflective layers including reflective layer pairs, the multilayer stack of reflective layers having a thickness in a range of from 138 nm to 414 nm;
- a capping layer on the multilayer stack of reflective layers; and
- an absorber layer on the capping layer.

2. The extreme ultraviolet (EUV) mask blank of claim 1, wherein the alloy of tantalum and nickel comprises from about 70 to about 85 wt. % tantalum and from about 15 to about 30 wt. % nickel.

3. The extreme ultraviolet (EUV) mask blank of claim 1, wherein the alloy of tantalum and nickel comprises from about 45 to about 55 wt. % tantalum and from about 45 to about 55 wt. % nickel.

4. The extreme ultraviolet (EUV) mask blank of claim 1, wherein the alloy of tantalum and nickel comprises from about 30 to about 45 wt. % tantalum and from about 55 to about 70 wt. % nickel.

5. The extreme ultraviolet (EUV) mask blank of claim 1, wherein the backside coating layer further comprises 0.1 wt.

% to about 10 wt. % of a dopant selected from one or more of boron, nitrogen or oxygen.

6. The extreme ultraviolet (EUV) mask blank of claim 1, wherein the backside coating layer comprises a thickness in a range of from 0.1 nm to 40 nm, and the multilayer stack has a thickness in a range of from 276 nm to 414 nm.

7. The extreme ultraviolet (EUV) mask blank of claim 1, wherein the backside coating layer comprises a thickness in a range of from 0.1 nm to 25 nm.

8. A method of manufacturing an extreme ultraviolet (EUV) mask blank comprising:

providing a substrate having a first side and a second side;

forming a backside coating layer comprising an alloy of tantalum and nickel on the first side of the substrate, the backside coating layer having a thickness in a range of from 0.1 nm to 50 nm;

forming a multilayer stack of reflective layers having a thickness in a range of from 138 nm to 414 nm on the second side of the substrate, the multilayer stack of reflective layers including a plurality of reflective layer pairs;

forming a capping layer on the multilayer stack of reflective layers; and forming an absorber layer on the capping layer.

9. The method of claim 8, wherein the alloy of tantalum and nickel comprises from about 70 to about 85 wt. % tantalum and from about 15 to about 30 wt. % nickel.

10. The method of claim 8, wherein the alloy of tantalum and nickel comprises from about 45 to about 55 wt. % tantalum and from about 45 to about 55 wt. % nickel.

11. The method of claim 8, wherein the alloy of tantalum and nickel comprises from about 30 to about 45 wt. % tantalum and from about 55 to about 70 wt. % nickel.

12. The method of claim 8, wherein the backside coating layer further comprises 0.1 wt. % to about 10 wt. % of a dopant selected from one or more of boron, nitrogen or oxygen.

13. The method of claim 6, wherein the alloy of tantalum and nickel is co-sputtered by a gas selected from one or more of argon (Ar), oxygen ($O_2$), or nitrogen ($N_2$) to form the backside coating layer.

14. The method of claim 7, wherein the alloy of tantalum and nickel is deposited using a bulk target having a same composition as the alloy of tantalum and nickel and is sputtered using a gas selected from one or more of argon (Ar), oxygen ($O_2$), or nitrogen ($N_2$) to form the backside coating layer.

15. The method of claim 8, wherein the backside coating layer comprises a thickness in a range of from 0.1 nm to 40 nm, and the multilayer stack has a thickness in a range of from 276 nm to 414 nm.

16. The method of claim 8, wherein the backside coating layer comprises a thickness in a range of from 0.1 nm to 25 nm.

17. An extreme ultraviolet (EUV) lithography system comprising:

an extreme ultraviolet light source; and a reticle comprising a substrate having a first side and a second side, the reticle having a pattern that represents a processing layer of an integrated circuit; a backside coating layer comprising an alloy of tantalum and nickel having a thickness on the first side of the substrate; a multilayer stack of reflective layers having a thickness in a range of from 276 nm to 414 nm on the second side of the substrate; and an absorber layer, over the multilayer stack, with a thickness of less than 80 nm and less than 2% reflectivity of an extreme ultraviolet (EUV) light at a wavelength of 13.5 nm, wherein the backside coating has a thickness in a range of from 0.1 nm to 50 nm.

18. The extreme ultraviolet (EUV) lithography system of claim 17, further comprising a capping layer between the multilayer stack and the absorber layer, for protecting the multilayer stack.

19. The extreme ultraviolet (EUV) lithography system of claim 17 wherein the reticle has a pattern that represents a processing layer of an integrated circuit.

20. The extreme ultraviolet (EUV) lithography system of claim 17, further comprising an anti-reflective coating on the absorber layer.

* * * * *